United States Patent
Lee et al.

[19]

[11] Patent Number: 6,163,074
[45] Date of Patent: Dec. 19, 2000

[54] INTEGRATED CIRCUIT BONDING PADS INCLUDING INTERMEDIATE CLOSED CONDUCTIVE LAYERS HAVING SPACED APART INSULATING ISLANDS THEREIN

[75] Inventors: Soo-cheol Lee, Seoul; Jong-hyon Ahn; Hyae-ryoung Lee, both of Kyungki-do, all of Rep. of Korea

[73] Assignee: Samsung Electronics Co., Ltd., Rep. of Korea

[21] Appl. No.: 09/387,954

[22] Filed: Sep. 1, 1999

Related U.S. Application Data

[63] Continuation-in-part of application No. 09/103,970, Jun. 24, 1998.

[30] Foreign Application Priority Data

Dec. 28, 1998 [KR] Rep. of Korea ...................... 98-59418

[51] Int. Cl.[7] .......................... H01L 21/44; H01L 21/4763
[52] U.S. Cl. ........................... 257/734; 257/779; 257/782; 257/784
[58] Field of Search ............................ 438/106; 257/734, 257/779, 780, 781, 782, 784, 737

[56] References Cited

U.S. PATENT DOCUMENTS

| | | | |
|---|---|---|---|
| 5,084,752 | 1/1992 | Satoh et al. ................................. | 357/68 |
| 5,248,903 | 9/1993 | Heim ........................................ | 257/748 |
| 5,250,843 | 10/1993 | Eichelberger . | |
| 5,403,777 | 4/1995 | Bryant et al. ............................ | 437/183 |
| 5,502,337 | 3/1996 | Nozaki ..................................... | 257/773 |
| 5,700,735 | 12/1997 | Shiue et al. ............................... | 438/612 |
| 5,707,894 | 1/1998 | Hsiao ....................................... | 437/209 |
| 5,736,791 | 4/1998 | Fujiki et al. ............................. | 257/781 |
| 6,016,000 | 1/2000 | Moslehi . | |
| 6,031,293 | 2/2000 | Hsuan et al. . | |

*Primary Examiner*—Kevin M. Picardat
*Assistant Examiner*—D. M. Collins
*Attorney, Agent, or Firm*—Myers Bigel Sibley & Sajovec

[57] ABSTRACT

Bonding pads for integrated circuits include first and second spaced apart conductive layers, a third continuous conductive layer between the first and second spaced apart conductive layers and an array of spaced apart insulating islands in the third continuous conductive layer that extend therethrough such that sidewalls of the insulating islands are surrounded by the third continuous conductive layer. A fourth continuous conductive layer also may be provided between the third continuous conductive layer and the second conductive layer and a second array of spaced apart insulating islands may be provided in the fourth continuous conductive layer, that extend therethrough, such that sidewalls of the insulating islands are surrounded by the fourth continuous conductive layer. A fifth continuous conductive layer also may be provided between the third and fourth continuous conductive layers and a third array of spaced apart insulating islands may be provided in the fifth continuous conductive layer, that extend therethrough, such that sidewalls of the third array of insulating islands are surrounded by the fifth continuous conductive layer. The first and second arrays of spaced apart insulating islands preferably laterally overlap each other and may be congruent to each other. The third array of spaced apart insulating islands also may laterally overlap the first and second arrays. Preferably, the third array of spaced apart insulating islands are of the same shape as the first array, but of different sizes.

49 Claims, 15 Drawing Sheets

INTEGRATED CIRCUIT BONDING PADS INCLUDING INTERMEDIATE CLOSED CONDUCTIVE LAYERS HAVING SPACED APART INSULATING ISLANDS THEREIN

CROSS-REFERENCE TO RELATED APPLICATION

This application is a continuation-in-part (CIP) of application Ser. No. 09/103,970 filed Jun. 24, 1998 and assigned to the assignee of the present application, the disclosure of which is hereby incorporated herein by reference in its entirety.

FIELD OF THE INVENTION

This invention relates to integrated circuits and methods of forming the same, and more particularly to bonding pads for integrated circuits and methods of forming the same.

BACKGROUND OF THE INVENTION

Integrated circuits, also referred to as "chips", are widely used in consumer and commercial electronic products. As is well known to those having skill in the art, an integrated circuit generally includes a substrate such as a semiconductor substrate and an array of bonding pads on the substrate. The bonding pads provide an electrical connection from outside the integrated circuit to microelectronic circuits in the integrated circuit.

FIG. 1 is a schematic view of an integrated circuit package including a plurality of bonding pads. As shown in FIG. 1, an integrated circuit 100, for example, a memory integrated circuit that includes a memory cell array portion 110 and a peripheral circuit portion 115, may include a plurality of bonding pads 200. The bonding pads 200 can act as a gate for a circuit terminal of the integrated circuit 100 and may be internally connected to an input/output (10) buffer circuit in the peripheral circuit portion 115.

As shown in FIG. 1, the integrated circuit 100 is attached to a lead frame 300. Wire bonding or other conventional techniques may be used to connect a respective wire 320 to a bonding pad 200 and to an inner lead tip 310 of the lead frame 300.

FIG. 2 is an enlarged top view of a bonding pad 200 of FIG. 1. FIG. 3 is a perspective view of the bonding pad of FIG. 2. FIG. 4 is a sectional view of the bonding pad taken along line IV–IV' of FIG. 2, and FIG. 5 is a sectional view of the bonding pad taken along line V–V' of FIG. 2.

In a conventional bonding pad structure as shown in FIGS. 2 through 5, independent conductive plugs 245, such as tungsten plugs fill a plurality of via holes 240 in an interconnection dielectric layer 250. The conductive plugs 245 electrically connect a lower aluminum interconnection layer 230 with an upper aluminum interconnection layer 260. Reference numerals 210, 220, and 270 denote an integrated circuit substrate, an interdielectric layer, and a wire bonding region, respectively.

Unfortunately, the pad structure shown in FIGS. 2 through 5 may have problems. For example, as shown in FIGS. 4 and 5, during sorting for separating good integrated circuits 100 from a wafer, cracks 330 may occur in the interconnection dielectric layer 250 due to the force of a probe pin of a tester that is applied to the wire bonding region 270. The cracks 330 also may occur in the interconnection dielectric layer 250 due to stress caused by mechanical impact and pressure applied during bonding of a wire 320 in the wire bonding region 270.

Cracks may occur because the upper aluminum interconnection layer 260 and the lower aluminum interconnection layer 230 which are relatively soft, may change in shape due to the stress applied during the sorting or wire bonding. However, the interconnection dielectric layer 250 which is relatively hard, does not readily change in shape. Thus, a stress higher than a predetermined value can cause a slip of unstable tungsten plugs 245 or cracks in the interconnection dielectric layer 250. The cracks 330 may extend to the inside of the insulating layer 250 surrounding the tungsten plugs 245 as shown in FIG. 5.

The cracks occurring in the interconnection dielectric layer 250 may generate an interconnection layer-open problem in which the upper and the lower interconnection layers 260 and 230 slip. Alternatively, a pad-open problem may be created in which contact between the wire 320 and the upper aluminum interconnection layer 260 becomes bad such that the wire 320 slips from the upper aluminum interconnection layer 260.

FIG. 6 is a top view of another conventional bonding pad structure in which tungsten plugs 245 are formed only in a peripheral region around the outside of the central wire bonding region, to reduce the interconnection dielectric layer cracking and to reduce interconnection layer or wire slipping. FIG. 7 is a sectional view of the bonding pad structure taken along line VII–VII' of FIG. 6. This bonding pad structure is disclosed in U.S. Pat. No. 5,248,903 and U.S. Pat. No. 5,502,337.

A bonding pad structure according to FIGS. 6 and 7 and the above two patents, may reduce the cracks of the interconnection dielectric layer 250. However, the number of the tungsten plugs 245 also is reduced, which can result in a weaker attachment between the tungsten plug 245 and the upper aluminum interconnection layer 260. As a result, the interconnection layer-open phenomenon, in which the upper aluminum interconnection layer 260 is broken, may more easily occur during wire bonding. Also, since the number of plugs is reduced, which may reduce the area for contacting the upper aluminum interconnection layer 260, an increase in the resistance $R_s$ and a reduction of current may result. Thus, sufficient current may not be supplied to a switching device in the integrated circuit, which may deteriorate the operation of the device.

SUMMARY OF THE INVENTION

It is therefore an object of the present invention to provide improved bonding pads for integrated circuits and methods of fabricating the same.

It is another object of the present invention to provide bonding pads and fabrication methods therefor that can reduce cracking in an insulating layer thereof.

These and other objects can be provided, according to the present invention, by bonding pads for integrated circuits that include first and second spaced apart conductive layers, a third continuous conductive layer between the first and second spaced apart conductive layers and an array of spaced apart insulating islands in the third continuous conductive layer that extend therethrough such that sidewalls of the insulating islands are surrounded by the third continuous conductive layer. A fourth continuous conductive layer also may be provided between the third continuous conductive layer and the second conductive layer and a second array of spaced apart insulating islands may be provided in the fourth continuous conductive layer, that extend therethrough, such that sidewalls of the insulating islands are surrounded by the fourth continuous conductive layer. A fifth continuous conductive layer also may be provided between the third and fourth continuous conductive layers and a third array of spaced apart insulating islands may be provided in the fifth continuous conductive layer, that extend therethrough, such that sidewalls of the third array of insulating islands are surrounded by the fifth continuous conductive layer.

The first and second arrays of spaced apart insulating islands preferably laterally overlap each other and may be congruent to each other. The third array of spaced apart insulating islands also may laterally overlap the first and second arrays. Preferably, the third array of spaced apart insulating islands are of the same shape as the first array, but of different sizes.

In other embodiments, the third continuous conductive layer includes a peripheral portion and a central portion. The array of spaced apart insulating islands in the third continuous conductive layer is located in the peripheral portion but not in the central portion. The sidewalls of the insulating islands may be cylindrical shaped, polygonal shaped or combinations thereof.

The present invention may be regarded as being opposite a conventional bonding pad in which spaced apart conductive plugs are provided in a dielectric layer between upper and lower pad layers. Rather, according to the present invention, spaced apart insulating islands are provided in a continuous conductive plug between the upper pad layer and the lower pad layer. By providing a continuous conductive plug with spaced apart insulating islands therein, cracking of the intermediate layer may be reduced. The resistance of the bonding pad also may be reduced.

Bonding pads according to the present invention preferably are included in integrated circuits wherein the first conductive layer is adjacent an integrated circuit substrate and the second conductive layer is remote from the integrated circuit substrate. The continuous conductive layers including an array of spaced apart insulating islands therein may be fabricated by forming a solid conductive layer on an underlying conductive layer, electrically connected thereto, etching a plurality of spaced apart vias in the conductive layer that extend therethrough, forming an insulating layer on the solid conductive layer and in the vias and removing the insulating layer from on the solid conductive layer such that the insulating layer remains in the vias. Alternatively, a solid insulating layer may be formed on the underlying conductive layer. The solid insulating layer is etched to define a plurality of spaced apart insulating islands on the underlying conductive layer. An intermediate conductive layer is formed on the underlying conductive layer between the islands and on the islands, and the intermediate conductive layer is removed from on the islands such that the intermediate conductive layer remains between the islands. These steps may be repeatedly performed in order to form a plurality of continuous conductive layers including arrays of spaced apart insulating islands therein. Multiple solid conductive layers also may be provided. Accordingly, improved bonding pads and fabrication methods therefor may be provided.

DESCRIPTION OF THE PREFERRED EMBODIMENTS

Figure 1:
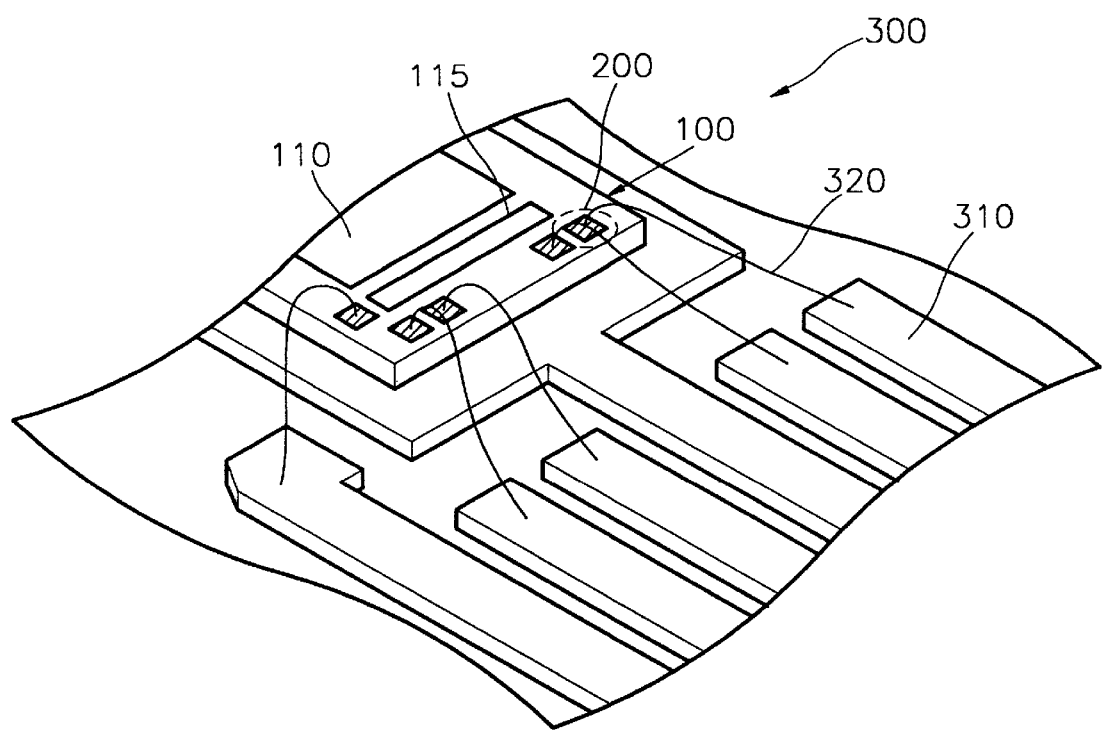
FIG. 1 is a schematic view of an integrated circuit attached to a lead frame.
Figure 2:
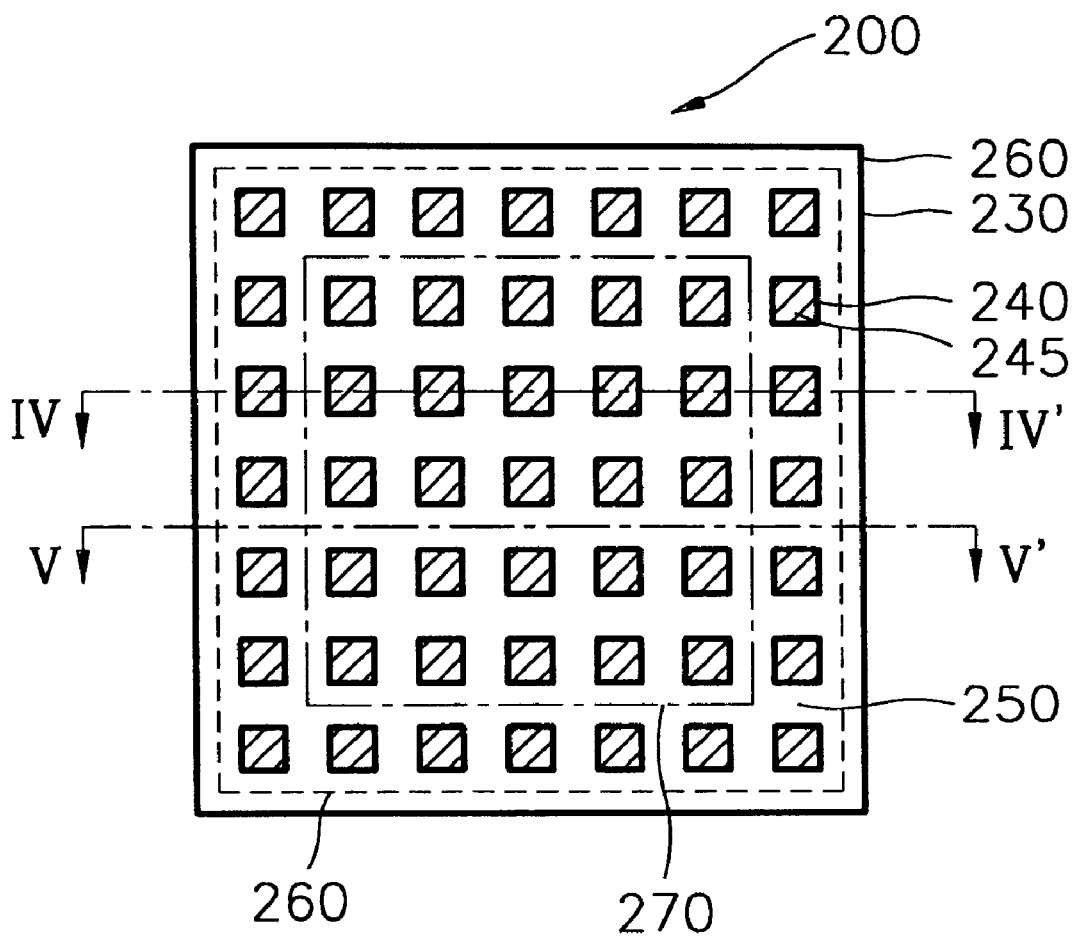
FIG. 2 is an enlarged top view of a conventional bonding pad structure of FIG. 1.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will be understood that when an element such as a layer, region or substrate is referred to as being "on" another element, it can be directly on the other element or intervening elements may also be present. In contrast, when an element is referred to as being "directly on" another element, there are no intervening elements present. Like numbers refer to like elements throughout.

Figure 8:
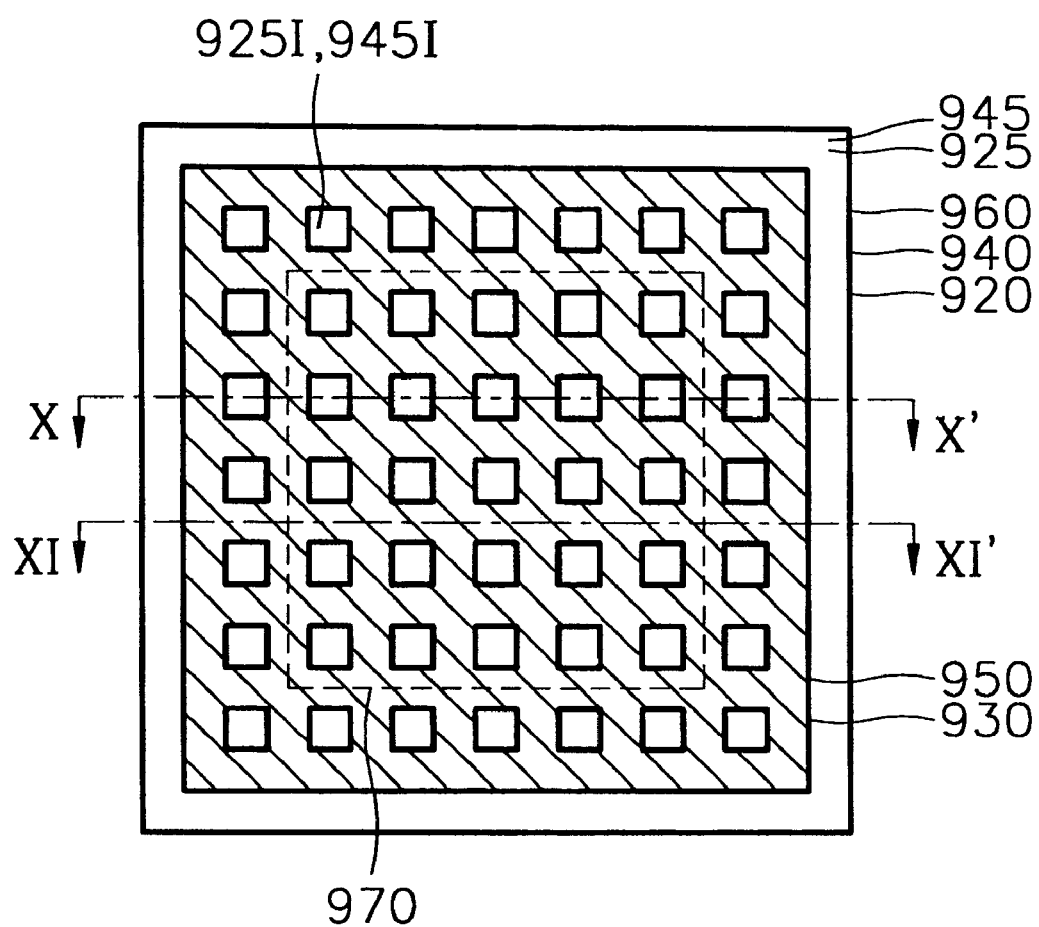
FIG. 8 is a top view of a bonding pad structure according to a first embodiment of the present invention.

In FIG. 8, reference numerals 920, 925I, 930, and 940 denote a lower interconnection layer, a lower island insulator, a lower single-bodied conductive plug, and an intermediate interconnection layer, respectively. Reference numerals 945I, 950, 960, and 970 denote an upper island insulator, an upper single-bodied conductive plug, an uppermost interconnection layer, and a wire bonding region, respectively Reference numerals 925 and 945 denote an interdielectric layer surrounding an outer wall of lower and upper single bodied conductive plug patterns, respectively. Single-bodied conductive plugs also may be referred to as continuous conductive layers. The interconnection layers also may be referred to as conductive layers and the island insulators also may be referred to as insulating islands. It also will be understood that the terms "upper"/"lower" and "top"/"bottom" are used to indicate respective relationships remote from/adjacent an integrated circuit substrate, rather than absolute directions.

Figure 9:
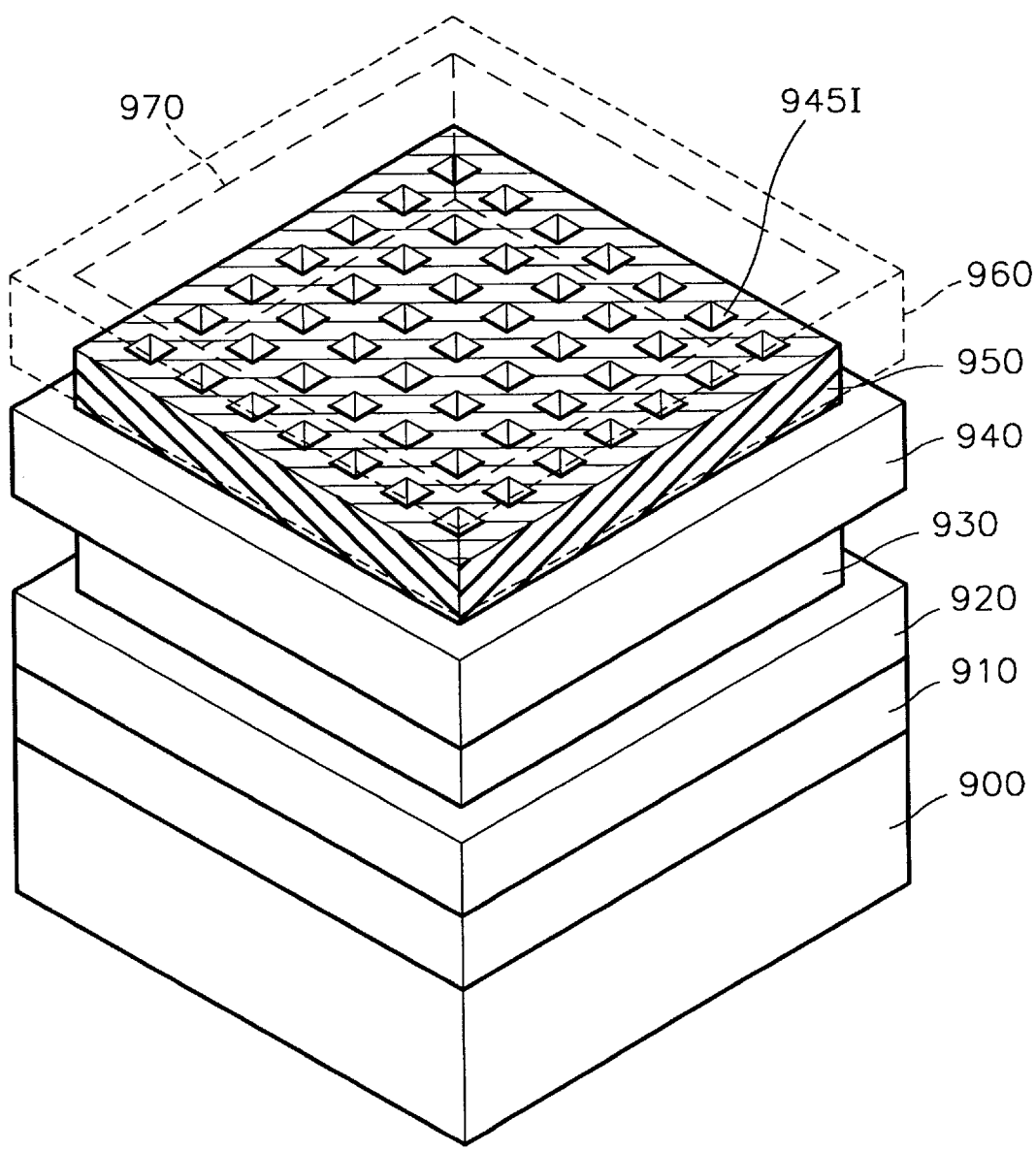
FIG. 9 is a perspective view of the bonding pad structure of FIG. 8.
Figure 10:
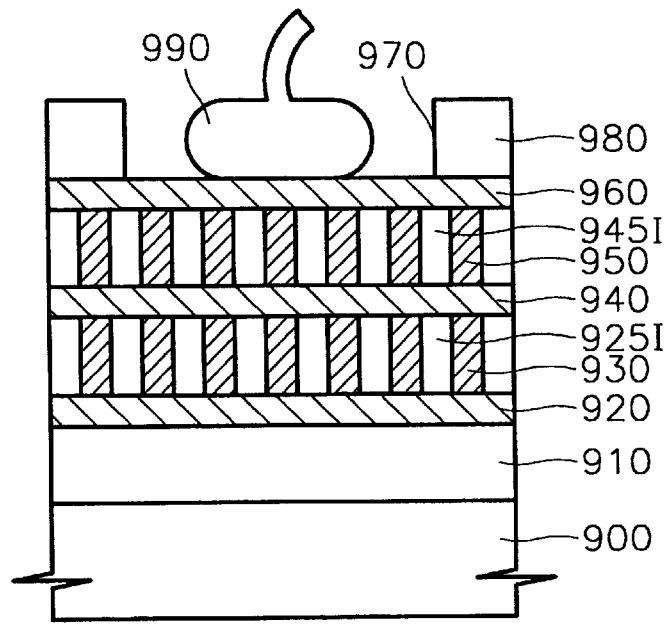
FIG. 10 is a sectional view of the bonding pad structure taken along line X–X' of FIG. 8.
Figure 11:
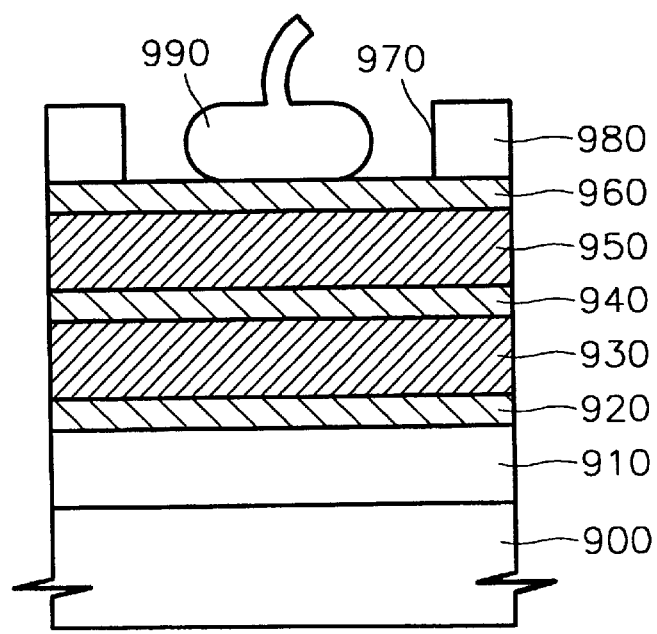
FIG. 11 is a sectional view of the bonding pad structure taken along line XI–XI' of FIG. 8.
Figure 12:
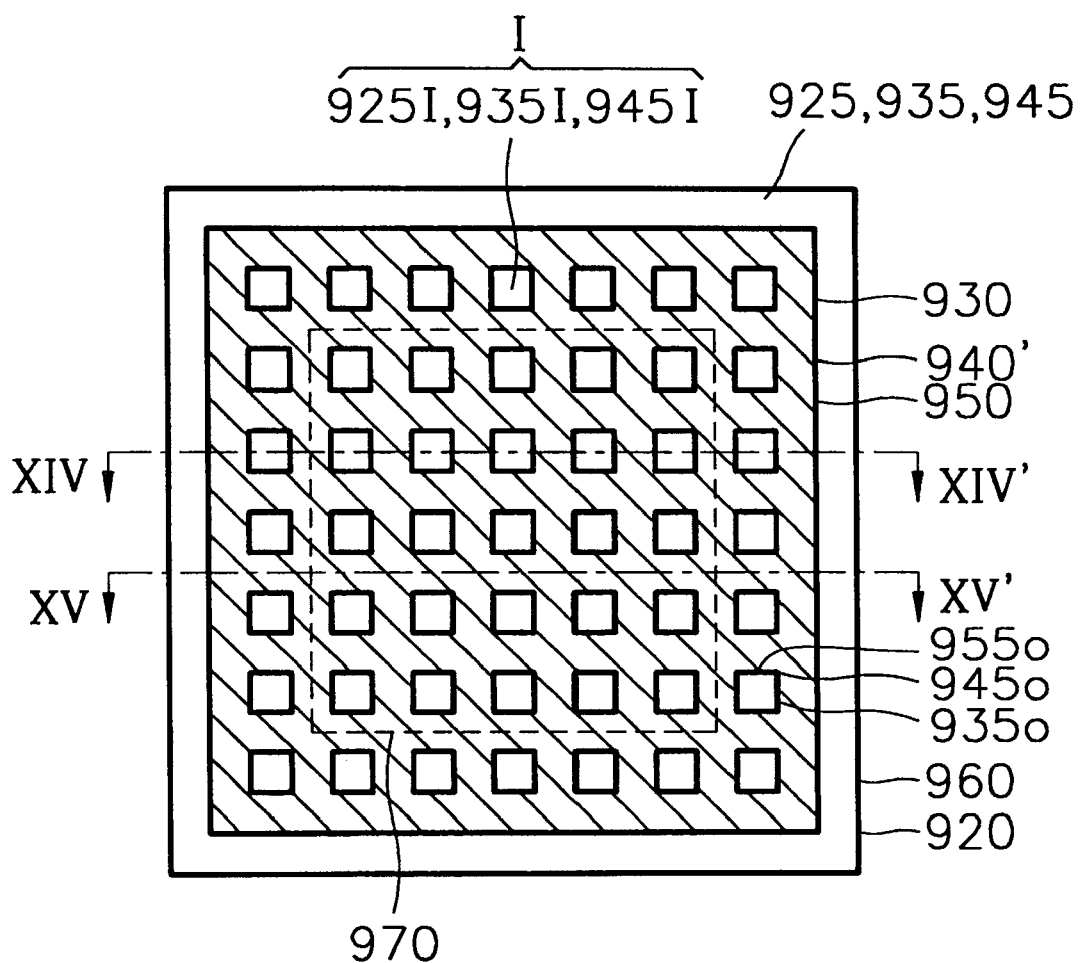
FIG. 12 is a top view of a bonding pad structure according to a second embodiment of the present invention.
Figure 13:
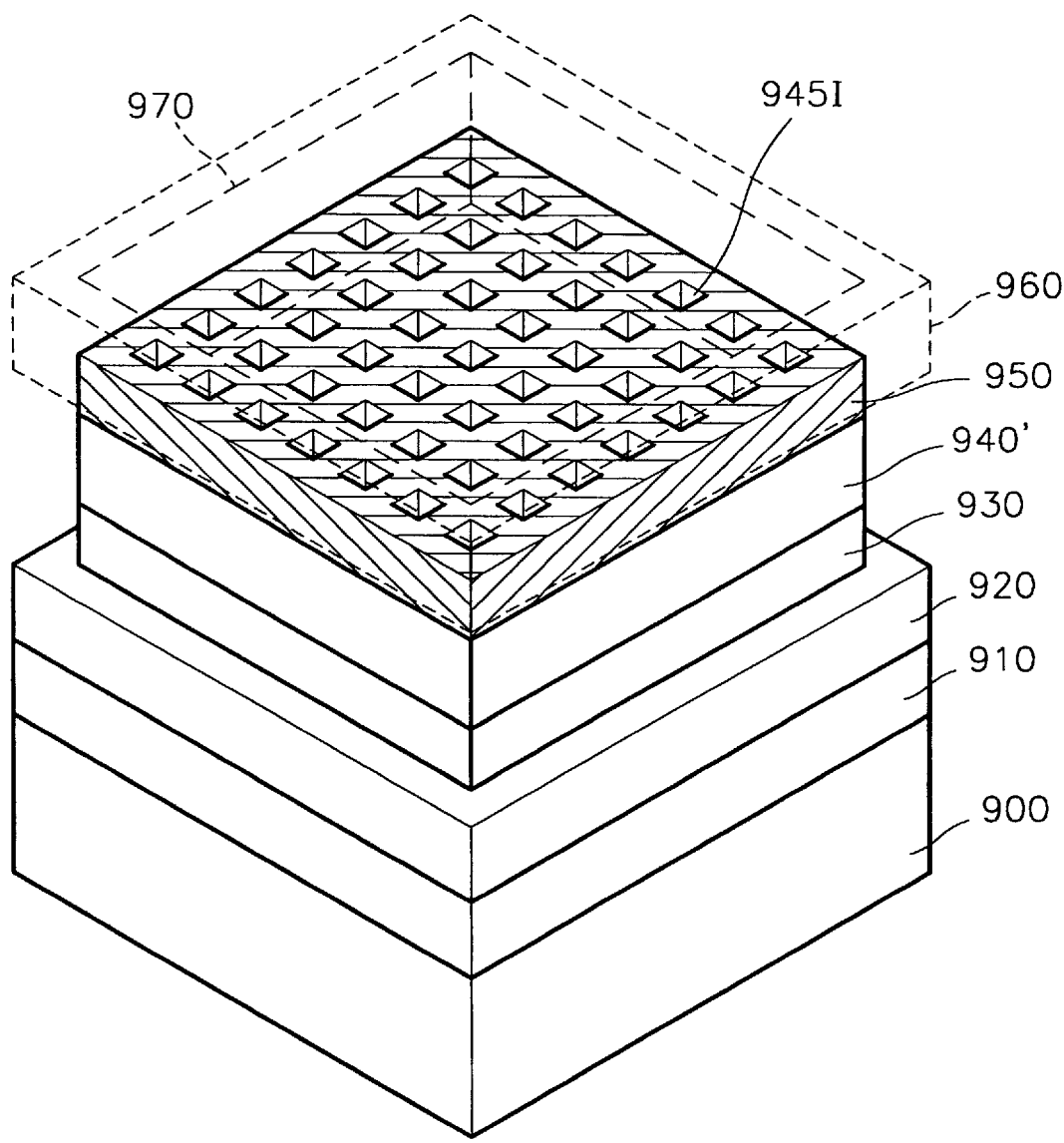
FIG. 13 is a perspective view of the bonding pad structure of FIG. 12.
Figure 14:
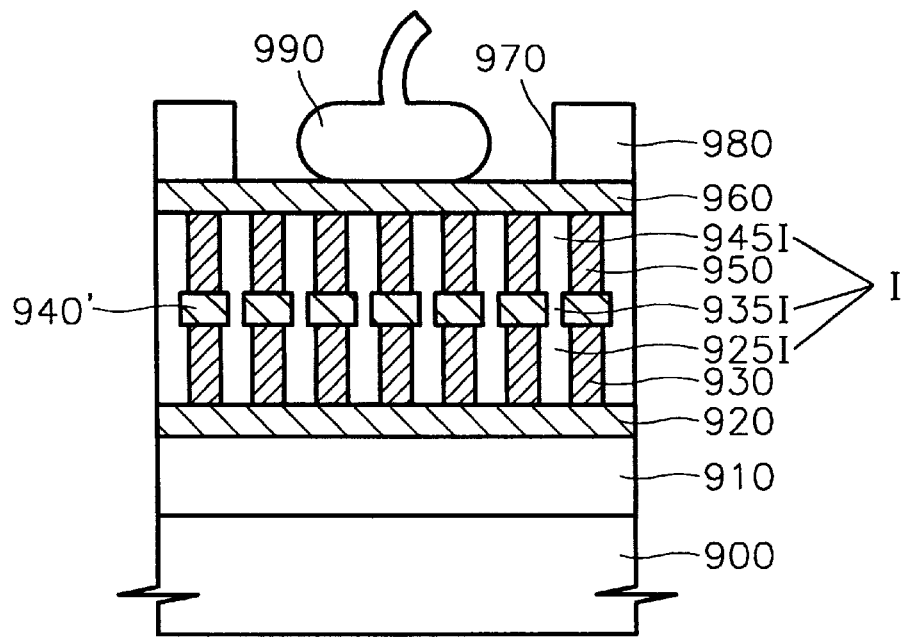
FIG. 14 is a sectional view of the bonding pad structure taken along line XIV–XIV' of FIG. 12.
Figure 15:
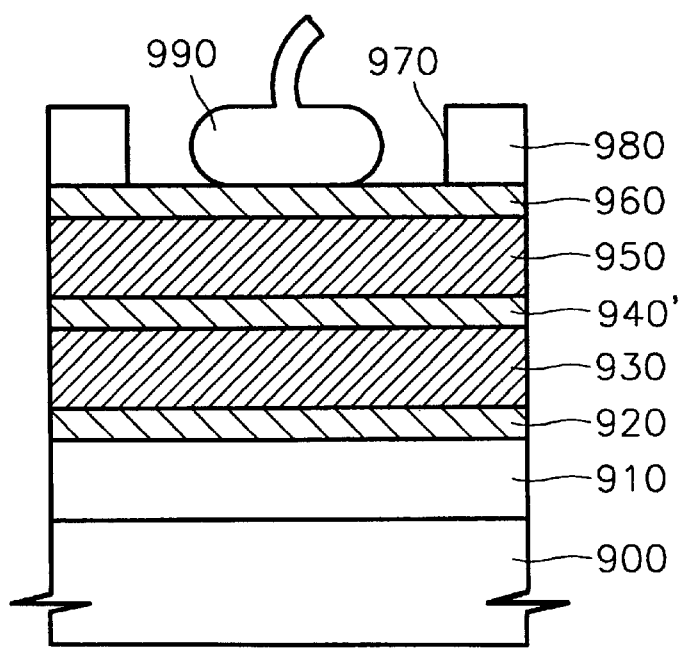
FIG. 15 is a sectional view of the bonding pad structure taken along line XV–XV' of FIG. 12.

Referring to FIGS. 9, 10 and 11, an interdielectric layer 910 is on an integrated circuit substrate 900, and a bonding pad structure having a triple-layered interconnection including the lower interconnection layer 920, the intermediate interconnection layer 940 and the uppermost interconnection layer 960 is on the interdielectric layer 910. The uppermost interconnection layer 960 includes the wire bonding region 970 to which a wire 990 is bonded. The wire 990 can act the gate for a circuit terminal connected to a peripheral I/O buffer circuit 115 (see FIG. 1).

The upper single bodied conductive plug 950 is arranged between the bottom surface of the uppermost interconnection layer 960 and the top surface of the intermediate interconnection layer 940 to thereby electrically connect the uppermost interconnection layer 960 and the intermediate interconnection layer 940. At least one upper island insulator 945I having sidewalls surrounded by the single bodied conductive plug, and upper and lower surfaces surrounded by the uppermost interconnection layer 960 and the intermediate interconnection layer 940, is formed in the upper single bodied conductive plug 950. As shown, an array of upper island insulators 945I preferably are provided.

The number and/or size of the upper island insulators 945I preferably are chosen such that they are within a range in which the area of the upper single conductive plug 950 contacting the uppermost interconnection layer 960 is 10% or more of the area of the uppermost interconnection layer 960. The contact area is 10% or more so that current of a predetermined value or higher can flow to the bonding pad portion. Preferably, a plurality of island insulators 945I, also referred to as an array of spaced apart insulating islands, can reduce the width of the island insulator 945I. Stated differently, an insulating layer interposed between the uppermost interconnection layer 960 and the intermediate interconnection layer 940 is partitioned into a plurality of island insulators 945I in the upper single bodied conductive plug 950. Accordingly, even if one of the island insulators 945I is cracked, other island insulators 945I may not be cracked. In general, the uppermost interconnection layer 960 functioning as a bonding pad is square in shape and has a size of 100 μm×100 μm. Preferably, the interval between the upper island insulators 945I is between about 0.3 μm and about 10 μm. Particularly, a plurality of island insulators 945I are arranged in a matrix so that the upper single bodied conductive plug 950 is formed as a mesh and thus the island insulators 945I may not crack under stress up to predetermined value.

The structure for connecting the intermediate interconnection layer 940 and the lower interconnection layer 920 preferably is the same as that which connects the intermediate interconnection 940 and the uppermost interconnection 960. That is, the intermediate interconnection 940 and the lower interconnection 920 are electrically connected by the lower single bodied conductive plug 930 including at least one lower island insulator 925I.

The above-described bonding pad structure is a triple-layered interconnection layer according to the first embodiment of the present invention. However, the bonding pad structure can be a double-layered interconnection layer, including the uppermost interconnection layer 960 and the intermediate interconnection layer 940, or a multi-layered interconnection layer.

The effect of a bonding pad structure according to the first embodiment of the present invention will be described with reference to the structure for connecting the uppermost interconnection layer 960 and the intermediate interconnection layer 940. A bonding pad structure according to the present invention may be regarded as a reversal of a conventional bonding pad structure in which the uppermost interconnection layer 260 (of FIG. 3) and the lowermost interconnection layer 230 (of FIG. 3) are insulated by a single bodied insulating layer 250 (of FIG. 3), and a plurality of independent conductive plugs 245 (of FIG. 3) in the insulating layer 250 connect the uppermost interconnection layer 260 and the lowermost interconnection layer 230. Rather, according to the invention, the conductive plug 950 connecting the uppermost interconnection 960 and the intermediate interconnection 940 becomes a continuous conductive plug, and at least part of the insulating layer interposed between the uppermost interconnection layer 960 and the intermediate interconnection layer 940 is partitioned into at least one island insulator 945I in the single bodied conductive plug 950.

The island insulator 945I has a sidewall completely surrounded by the single bodied conductive plug 950 and top and bottom surfaces covered with the interconnection layers 960 and 940, so that it has a stable structure. Thus, when a mechanical stress of a known amount is applied during chip sorting and/or wire bonding, the island insulator 945I may not crack. Also, in the case where a crack does form in an island insulator 945I, the crack may not extend to an adjacent island insulator 945I.

Referring now to FIG. 12 through FIG. 15, in a second embodiment, an intermediate interconnection layer 940' is not formed in a continuous plate shape, but rather includes an island insulator 935I like the upper and the lower single bodied conductive plugs 950 and 930. Thus, the island insulators in the intermediate interconnection layer can overlap the island insulators in the upper and the lower single bodied conductive plugs 950 and 930. Preferably, the island insulator 945I in the upper single bodied conductive plug 950 and the island insulator 925I in the lower single bodied conductive plug 930 are connected to the island insulator 935I in the intermediate interconnection 940', to thereby form one island insulator I. When the island insulators 945I and 925I in the upper and the lower conductive plugs 950 and 930 and the island insulator 935I interposed in the intermediate interconnection are connected to be one island insulator, the thickness of the island insulator I is the sum of the thicknesses of the three insulators 925I, 935I and 945I, such that the resistance to stress may be increased.

Figure 16:
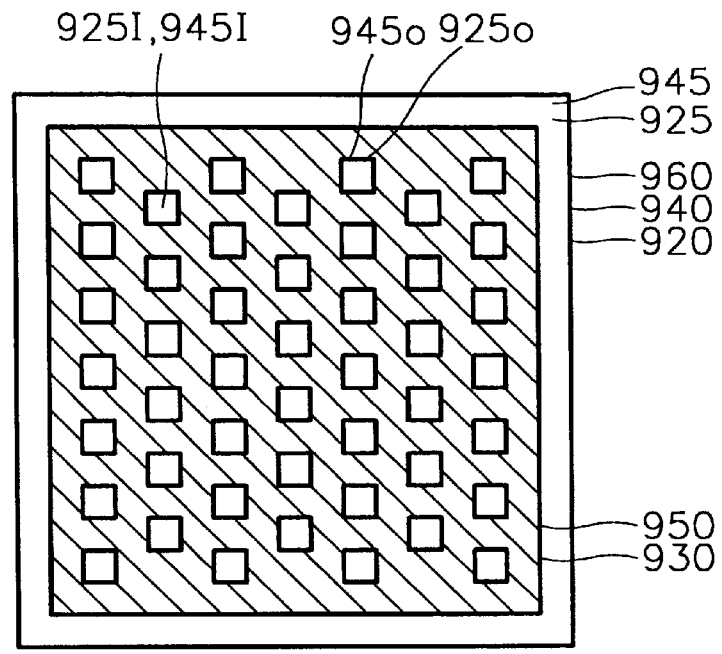
FIG. 16 is a top view of a bonding pad structure according to a third embodiment of the present invention.

Referring to FIG. 16, in a third embodiment, a plurality of island insulators 925I and 945I are formed in a zig-zag arrangement.

Figure 17:
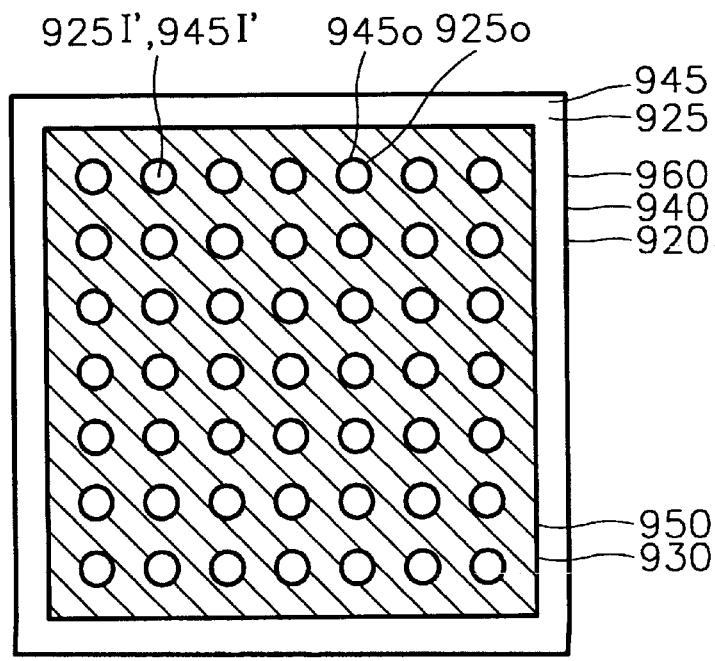
FIG. 17 is a top view of a bonding pad structure according to a fourth embodiment of the present invention.

Referring to FIG. 17, in a fourth embodiment, island insulators 945I' and 925I' are of a cylinder shape. Also, the island insulators may be formed by various multiangular or polygonal prisms, such as triangular or pentaangular prisms.

Figure 18:
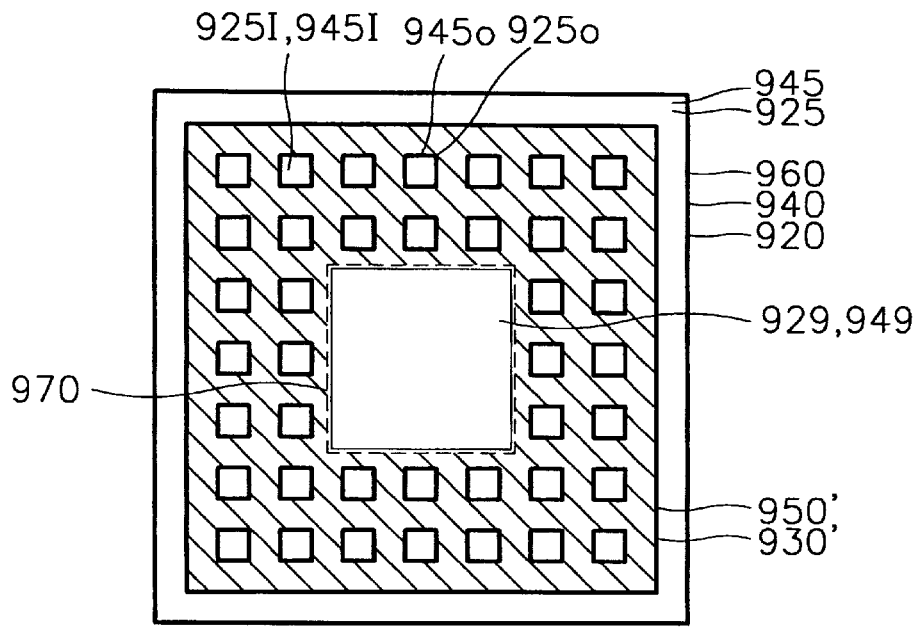
FIG. 18 is a top view of a bonding pad structure according to a fifth embodiment of the present invention.

Referring to FIG. 18, in a fifth embodiment, single bodied conductive plugs 930' and 950' are formed only under peripheral regions around the outside of the region covered by wire bonding region 970 of the uppermost interconnection layer, and insulators 929 and 949 are formed under the central wire bonding region 970. According to the fifth embodiment, plugs which can potentially seed a crack are not formed under the wire bonding region 970, so that cracks may not occur in the insulators 929 and 949, and a predetermined contacting area with the uppermost interconnection layer 960 can be provided by the single bodied conductive plugs 930' and 950' formed under the regions around the periphery of the wire bonding region.

Figure 19:
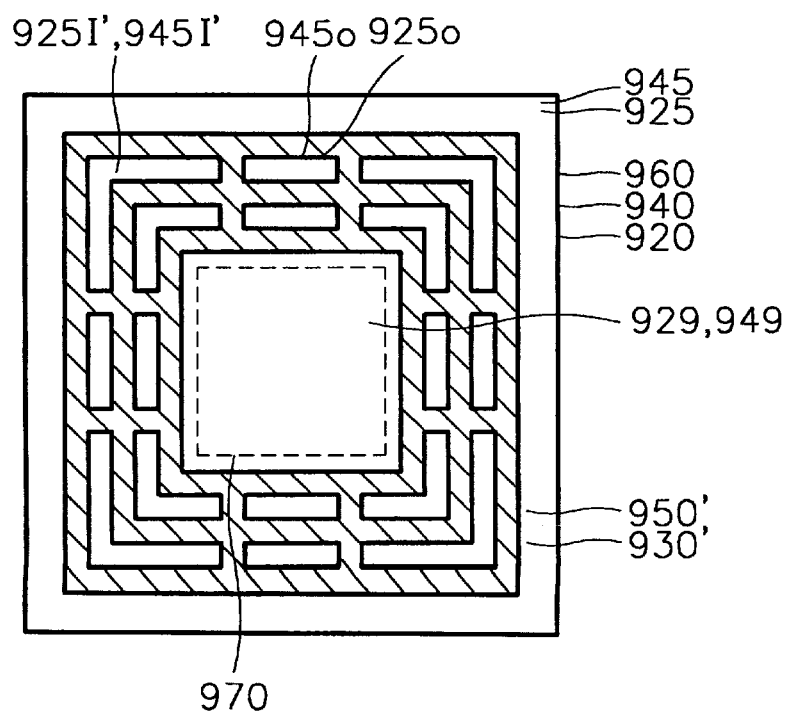
FIG. 19 is a top view of a bonding pad structure according to a sixth embodiment of the present invention.

Referring to FIG. 19, in a sixth embodiment, the island insulators 925I' and 955I' that are formed in the single bodied conductive plugs 930' and 950' are elongated.

Methods of forming a bonding pad structure of FIG. 9 according to the first embodiment of the present invention now will be described, with reference to FIG. 20.

The step of forming an intermediate interconnection 940 and an uppermost interconnection 960 will be described. At Block 2000, the intermediate interconnection 940 is formed on an integrated circuit substrate 900 where underlayers 910, 920 and 930 have been formed. Subsequently, an interdielectric layer 945 is formed on the intermediate interconnection 940, at Block 2010. The interdielectric layer 945 may be formed by depositing an insulation material on the intermediate interconnection 940, and planarizing the resultant structure through etchback and/or chemical mechanical polishing.

Then, the interdielectric layer 945 is patterned using a mask to define a region where an upper single bodied conductive plug is to be formed, at Block 2020. Thus, the intermediate interconnection 940 is partially exposed, and a continuous trench defining at least one island insulator 945I is formed.

A plurality of island insulators 945I preferably are patterned in matrix or a zig-zag arrangement. An interval between the island insulators 945I, i.e., the width of the trench may be between about 0.3 μm and about 10 μm. A reason for forming an interval of 0.3 μm or more is to reduce cracking of an island insulator adjacent a cracked island insulator. Also, a reason for forming an interval of 10 μm or less is to sufficiently fill the trench between the island insulators with the conductive plug.

A conductive layer filling the trench is formed of a conductive material, e.g., tungsten, copper or aluminum, at Block 2030. Subsequently, the conductive layer filling the trench is planarized through etchback and/or chemical mechanical polishing to complete an upper single conductive plug 950 surrounding the sidewalls of the island insulators 945I, at Block 2040. Preferably, the total area of the top surface of the upper conductive plug 950 is 10% or more of the area of the uppermost interconnection 960 to be formed.

In another alternative, a solid conductive layer is formed on an underlying conductive layer, electrically connected thereto. A plurality of spaced apart vias is etched in the solid conductive layer that extend therethrough. An insulating layer is formed on the solid conductive layer and in the vias. The insulating layer is removed from on the solid conductive layer, for example using etchback and/or chemical mechanical polishing, such that the insulating layer remains in the vias.

Figure 20:
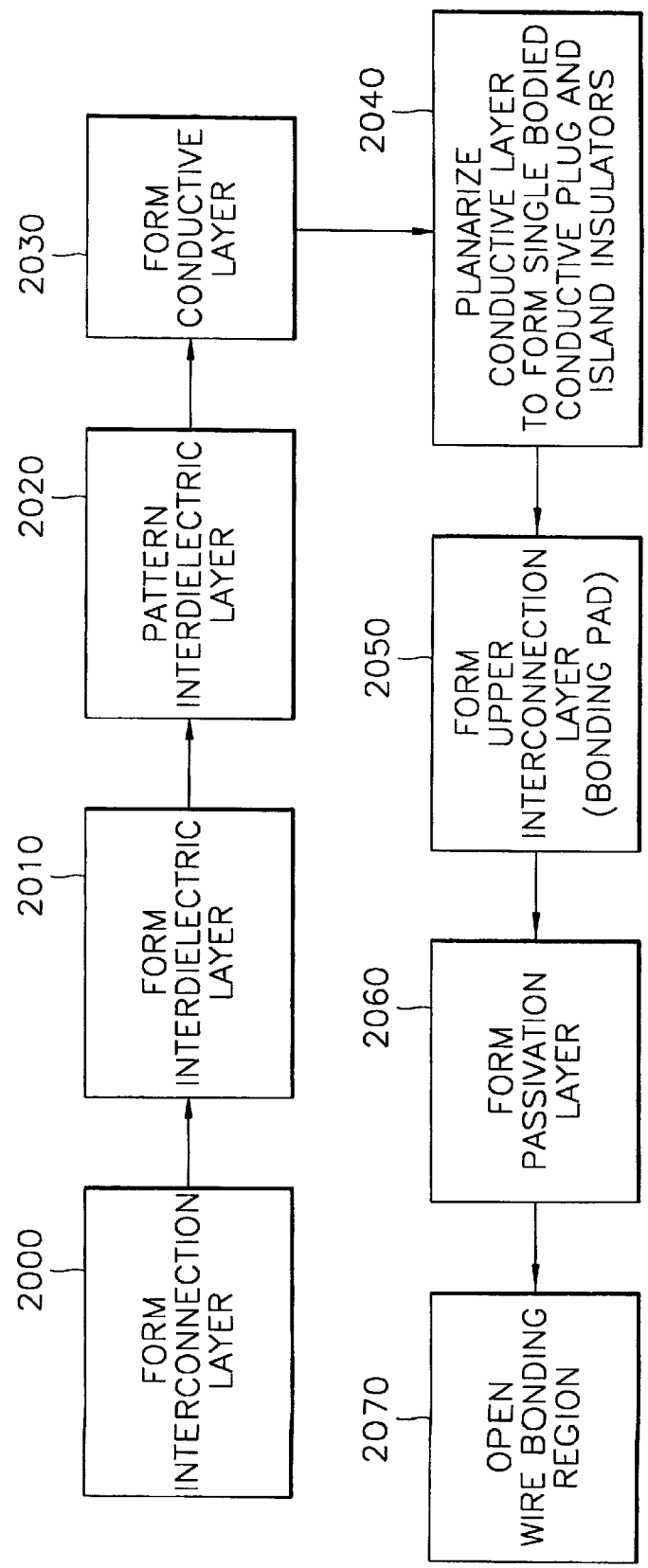
FIG. 20 is a block diagram of methods of fabricating bonding pad structures according to the present invention.

Continuing with the description of FIG. 20, the uppermost interconnection 960 functioning as a bonding pad is formed on the top surface of the upper single bodied conductive plug 950 at Block 2050. Then, a planarization layer 980 is formed on the surface of the uppermost interconnection 960 at Block 2060. The planarization layer 980 preferably is formed of a material which is water resistant, resistant to stress, has a high step coverage and is uniform. Subsequently, the planarization layer 980 is patterned to expose the wire bonding region 970 of the uppermost interconnection 960 at Block 2070.

The process of forming layers under the intermediate interconnection layer 940, i.e., a lower interconnection layer 920 and a lower single bodied conductive plug 930 may be performed by the same steps as Blocks 2000 through 2040 before the step of forming the intermediate interconnection layer 940. The bonding pad structure of a multi-layered interconnection structure can be formed by repeating the steps for forming the underlayer structure.

In a method of fabricating a bonding pad structure (see FIGS. 13 and 14) according to the second embodiment, the intermediate interconnection layer 940' may be formed in the same manner as the upper and lower single bodied conductive plugs 950 and 930. That is, a lower single bodied conductive plug 930 including a lower island insulator 925I is formed in Blocks 2000 through 2040, and then a single bodied intermediate interconnection 940' including an intermediate island insulator 935I partially overlapping the lower single bodied conductive plug 930 is formed in Blocks 2010 through 2040. The step of forming the upper single bodied conductive plug 950 and the uppermost interconnection 960 may be performed in the same manner as the first embodiment. Preferably, the lower, intermediate and upper island insulators 925I, 935I and 945I are formed in one body.

The present invention now will be described with reference to the following Examples. These Examples shall not be construed as limiting the scope of the present invention.

EXAMPLE 1

First samples having a bonding pad structure according to the present invention were provided. That is, a four-layered aluminum interconnection was formed on a substrate and single-bodied, meshed tungsten plugs having island insulators separated by an interval of 3.4 μm were formed between interconnections, to thereby electrically connect the interconnections. A planarized layer was formed on the uppermost interconnection layer, and the resultant structure was patterned to expose a bonding wire region. Then, a wire was bonded by a wedge method to provide a sample.

After completing the bonding pad structure, the wire-pulling strength was measured using a wire-pulling strength measuring apparatus.

Figure 3:
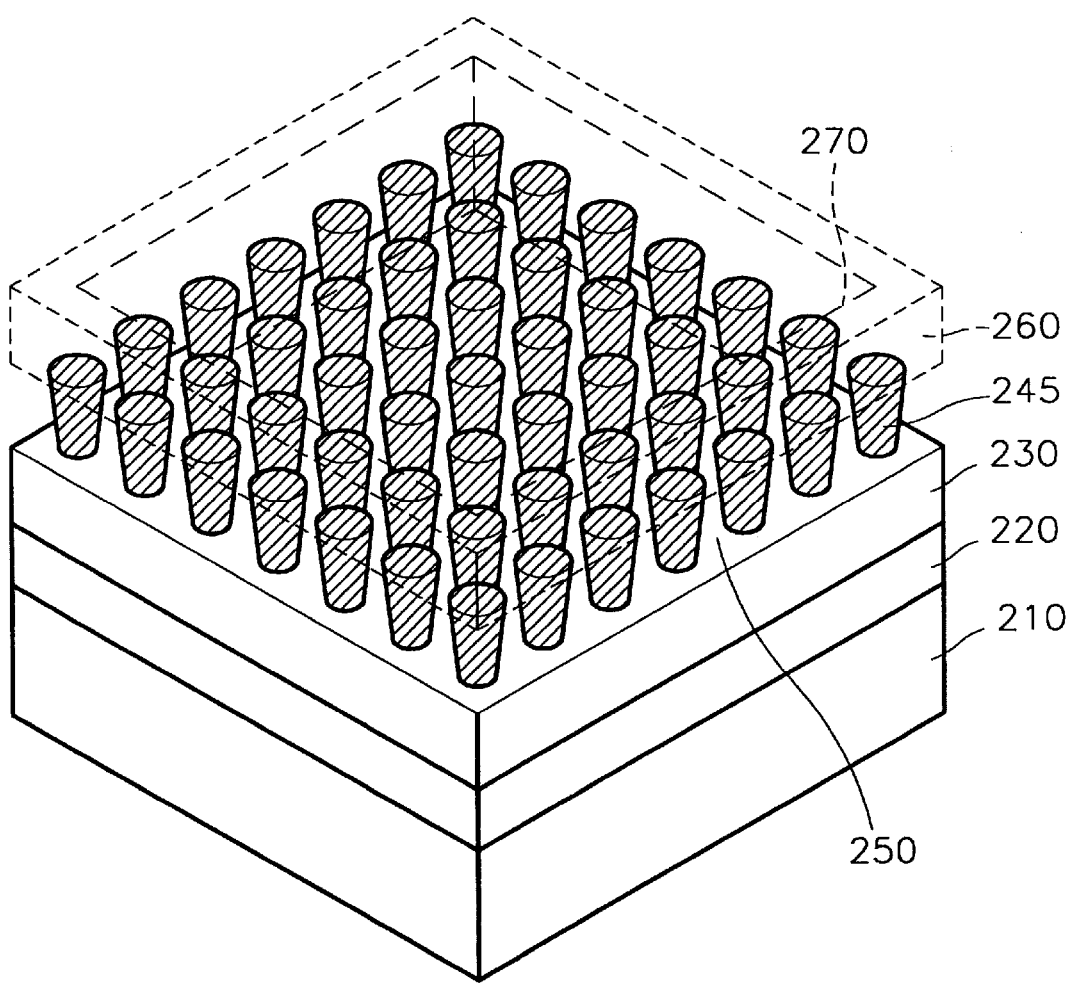
FIG. 3 is a perspective view of the bonding pad structure of FIG. 2.
Figure 4:
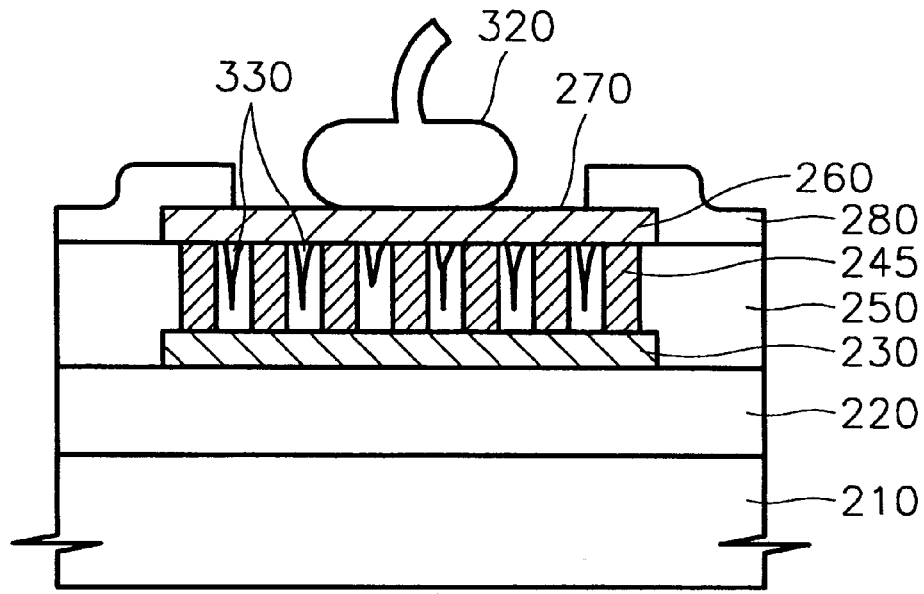
FIG. 4 is a sectional view of the bonding pad structure taken along line IV–IV' of FIG. 2.
Figure 5:
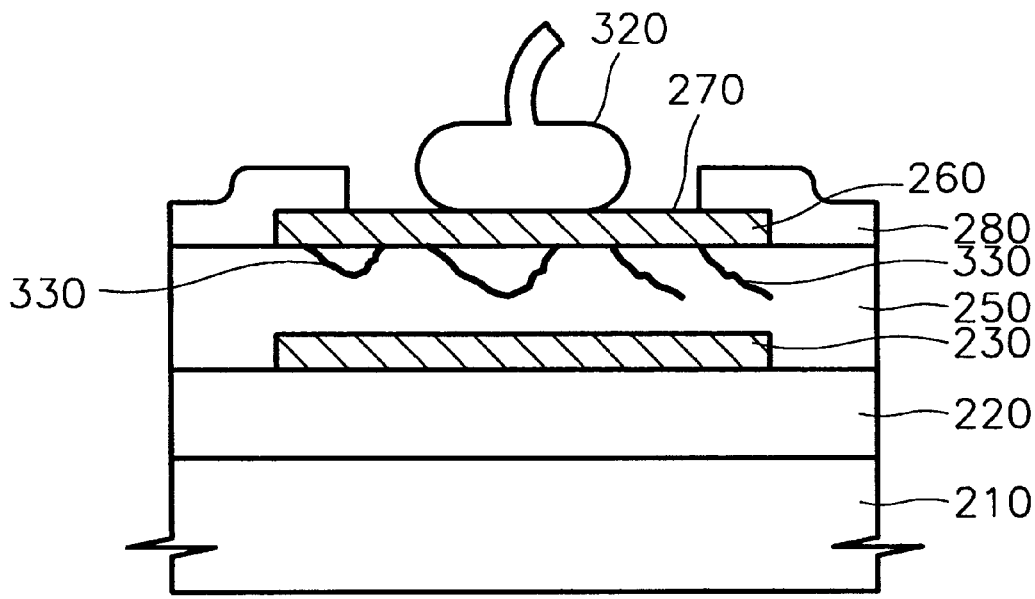
FIG. 5 is a sectional view of the bonding pad structure taken along line V–V' of FIG. 2.
Figure 6:
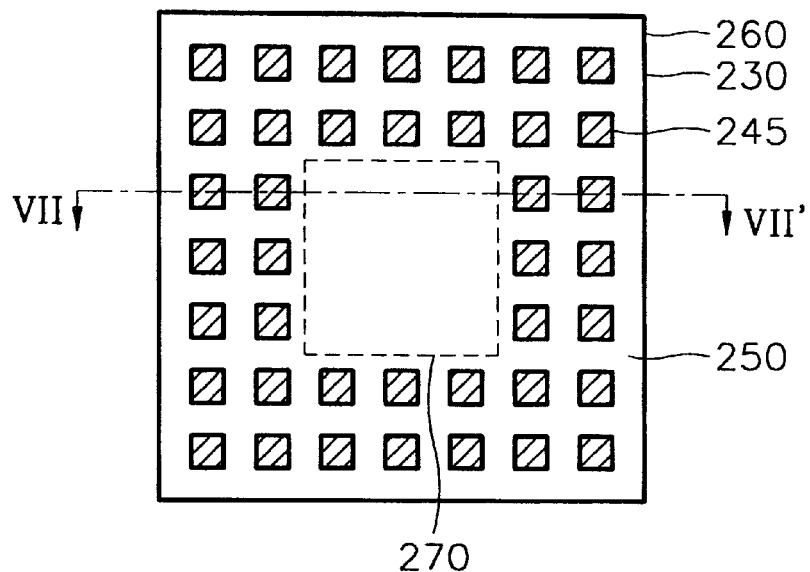
FIG. 6 is a top view of another conventional bonding pad structure.
Figure 7:
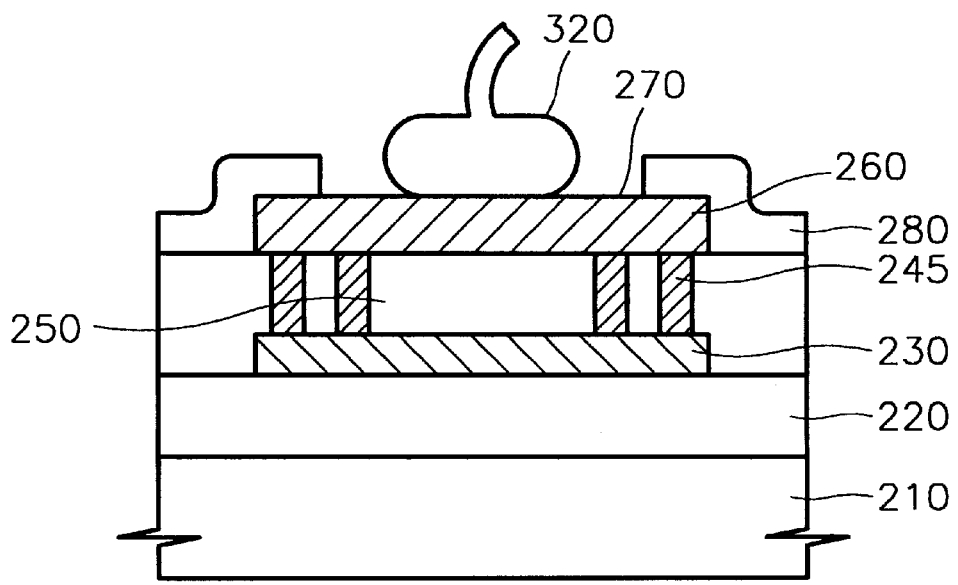
FIG. 7 is a sectional view of the bonding pad structure taken along line VII–VII' of FIG. 6.

The number of first samples having a bonding pad structure according to the present invention was 170. Also, 197 first control samples having a conventional bonding pad as shown in FIG. 3 and 170 second control samples having a conventional bonding pad as shown in FIG. 7 were provided. The wire-pulling strength of the control samples was measured in the same manner.

Figure 21:
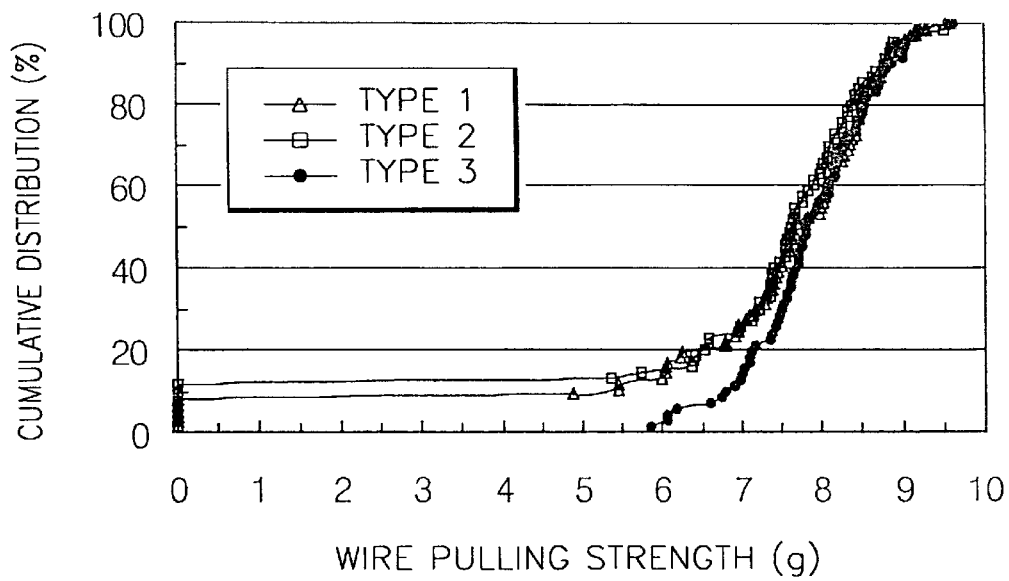
FIG. 21 is a graph showing the pulling strength of a wire bonded to a bonding pad structure according to the present invention compared to a conventional bonding pad.

The measured results are shown in Table 1 and in FIG. 21. In FIG. 21, -○- indicates the wire-pulling strength of a bonding pad (Sample 1) according to the present invention, -Δ- indicates the wire-pulling strength of a conventional bonding pad (Control Sample 1), and -□- indicates the wire-pulling strength of another conventional bonding pad (Control Sample 2), respectively. The accumulated distribution (%) indicates the percentage of the number of samples in which the wire slipped during an increase in the pulling strength from 0 g to 10 g. In Table 1, the accumulated distribution indicates the percentage of the number of samples in which the wire was separated at a value of 6 g or less of pulling strength.

TABLE 1

|  | Sample 1 | Control Sample 1 | Control Sample 2 |
|---|---|---|---|
| Number of samples having separated wire (6 g or less) | 5 | 34 | 21 |
| Accumulated distribution (%) | 2.94 | 17.26 | 21.35 |

It will be understood from Table 1 and FIG. 21 that the wire-pulling strength of a pad according to the present invention can be much higher than that of a conventional pad.

EXAMPLE 2

In testing the first sample and the first and second control samples which are the same as those of the first example, a pad-open phenomenon in which a wire slips due to bad contact between the wire and the aluminum interconnection layer acting as a bonding pad, and an interconnection-open phenomenon in which the interconnection layer slips during bonding, were measured. The pad-open and the interconnection-open were measured, and then the number of cracks generated from an island insulator under the uppermost aluminum interconnection layer or an interdielectric layer were measured in 158 of the first samples (Sample 1), 140 first control samples (Control Sample 1) and 142 of the second control samples (Control Sample 2). The planarized layer of each of the samples and the uppermost aluminum interconnection layer thereof were removed using an appropriate etching solution, and then the number of cracks were measured using a scanning electron microscope. The result is shown in Table 2 and in FIG. 22.

TABLE 2

|  |  | Sample 1 | Control Sample 1 | Control Sample 2 |
|---|---|---|---|---|
| Inter-connection-opens | Number of samples | 0 | 17 | 0 |
|  | Accumulated distribution | 0 | 8.63 | 0 |
| Pad-opens | Number of samples | 62 | 90 | 97 |
|  | Accumulated distribution | 36.47 | 45.69 | 57.06 |
| Cracks | Number of samples | 0 | 139 | 5 |
|  | Accumulated distribution | 0 | 87.97 | 3.57 |

Figure 22:
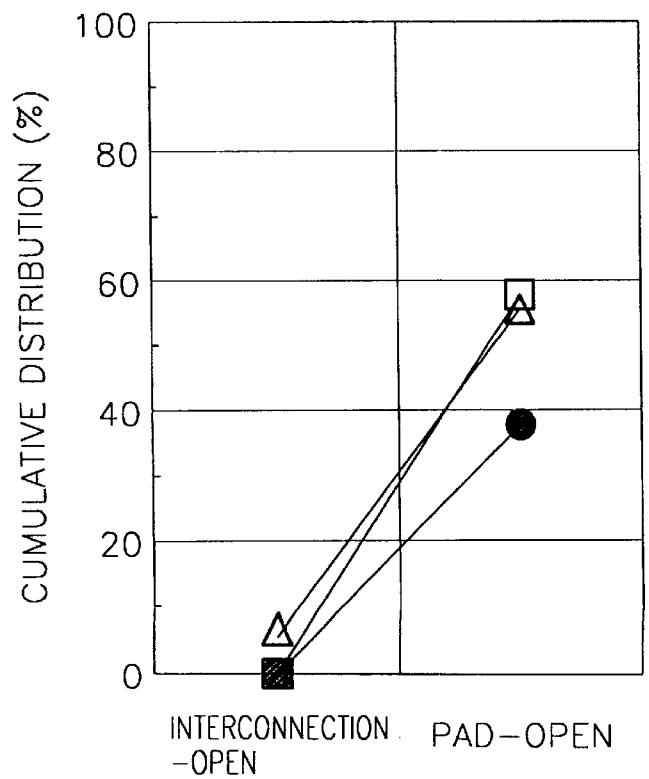
FIG. 22 is a graph showing pad-open and interconnection layer-open in a bonding pad structure according to the present invention compared to a conventional bonding pad structure.

Referring to Table 2 and FIG. 22, many cracks were generated in the first control sample and the second control sample having a conventional pad structure, while no cracks were generated in the first sample having a pad structure according to the present invention. Also, the interconnection-open phenomenon did not occur since there were no cracks, and the number of occurrences of the pad-open phenomenon was remarkably reduced compared to conventional pad structures.

According to bonding pad structures of the present invention, an uppermost interconnection layer and an interconnection under the uppermost interconnection layer are connected by a continuous conductive plug, so that a contact area greater than or equal to a predetermined size may be obtained. Thus, sufficient current can be transmitted into the bonding pad structure.

Also, an insulating layer between the uppermost interconnection layer and the lower interconnection layer is formed as an island insulator in a single bodied conductive plug. Thus, cracks in the insulator caused by physical stress when a probe pin is applied for chip-sorting and/or when bonding a wire is applied may be reduced. Moreover, since the insulator is of an island type, cracks may be prevented from extending to a peripheral insulator.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An internal structure of a bonding pad for an integrated circuit having an array of bonding pads thereon, the internal structure of a bonding pad comprising:

first and second spaced apart conductive layers;

a third continuous conductive layer between the first and second spaced apart conductive layers and electrically connected to the first and second spaced apart conductive layers; and an array of spaced apart insulating islands in the third continuous conductive layer and extending therethrough such that sidewalls of the array of insulating islands are surrounded by the third continuous conductive layer.

2. A bonding pad according to claim 1 wherein the array of spaced apart insulating islands is a first array of spaced apart insulating islands, the bonding pad further comprising:

a fourth continuous conductive layer between the third continuous conductive layer and the second conductive layer and electrically connected to the third continuous conductive layer and to the second conductive layer; and a second array of spaced apart insulating islands in the fourth continuous conductive layer and extending therethrough such that sidewalls of the second array of insulating islands are surrounded by the fourth continuous conductive layer.

3. A bonding pad according to claim 2 further comprising:

a fifth conductive layer between the third and fourth continuous conductive layers.

4. A bonding pad according to claim 2 further comprising:

a fifth continuous conductive layer between the third and fourth continuous conductive layers; and a third array of spaced apart insulating islands in the fifth continuous conductive layer and extending therethrough such that sidewalls of the third array of insulating islands are surrounded by the fifth continuous conductive layer.

5. A bonding pad according to claim 2 wherein the first and second arrays of spaced apart insulating islands laterally overlap each other.

6. A bonding pad according to claim 2 wherein the first and second arrays of spaced apart insulating islands are congruent to each other.

7. A bonding pad according to claim 5 wherein the first, second and third arrays of spaced apart insulating islands laterally overlap each other.

8. A bonding pad according to claim 7 wherein the first and second arrays of spaced apart insulating islands also are congruent to each other.

9. A bonding pad according to claim 8 wherein the third array of spaced apart insulating islands are of same shape as the first array of spaced apart insulating islands but of different sizes.

10. A bonding pad according to claim 1 wherein the first and second spaced apart conductive layers are first and second solid spaced apart conductive layers.

11. A bonding pad according to claim 1 wherein the third continuous conductive layer includes a peripheral portion and a central portion and wherein the array of spaced apart insulating islands in the third continuous conductive layer is located in the peripheral portion but not in the central portion.

12. A bonding pad according to claim 1 wherein the sidewalls of the insulating islands are cylindrical shaped, polygonal shaped or combinations thereof.

13. An internal structure of a bonding pad for an integrated circuit having an array of bonding pads thereon, the internal structure of a bonding pad comprising:

an upper pad layer for attachment of a wire thereto;

a lower pad layer for attachment to an integrated circuit;

an intermediate pad layer between the upper pad layer and the lower pad layer, the upper pad layer, the intermediate pad layer and the lower pad layer being spaced apart from one another;

a first continuous conductive plug between the upper and intermediate pad layers and electrically connected to the upper and intermediate pad layers;

a first array of spaced apart first insulating islands in the first continuous conductive plug and extending therethrough Such that sidewalls of the first insulating islands are surrounded by the first continuous conductive plug;

a second continuous conductive plug between the lower and intermediate pad layers and electrically connected to the lower and intermediate pad layers; and a second array of second spaced apart insulating islands in the second continuous conductive plug and extending therethrough such that sidewalls of the second insulating islands are surrounded by the second continuous conductive plug.

14. A bonding pad according to claim 13 wherein the first and second arrays of spaced apart insulating islands laterally overlap each other.

15. A bonding pad according to claim 14 wherein the first and second arrays of spaced apart insulating islands are congruent to each other.

16. A bonding pad according to claim 13 further comprising:

a third array of spaced apart third insulating islands in the intermediate pad layer and extending therethrough such that sidewalls of the third insulating islands are surrounded by the intermediate pad layer.

17. A bonding pad according to claim 16 wherein the first, second and third arrays of spaced apart insulating islands laterally overlap each other.

18. A bonding pad according to claim 17 wherein the first and second arrays of spaced apart insulating islands also are congruent to each other.

19. A bonding pad according to claim 18 wherein the third array of spaced apart insulating islands are of same shape as the first array of spaced part insulating islands but of different sizes.

20. A bonding pad according to claim 13 wherein the upper, lower and intermediate pad layers are solid upper lower and intermediate pad layers.

21. A bonding pad according to claim 13 wherein the first and second continuous conductive plugs each includes a peripheral portion and a central portion and wherein the first and second arrays of spaced apart first and second insulating islands in the respective first and second continuous conductive plugs are located in the peripheral portions but not in the central portions.

22. A bonding pad according to claim 13 wherein the sidewalls of the first and second insulating islands are cylindrical shaped, polygonal shaped or combinations thereof.

23. An integrated circuit comprising:

an integrated circuit substrate; and an array of bonding pads on the integrated circuit substrate, at least one of the bonding pads having an internal structure comprising:

first and second spaced apart conductive layers, wherein the first conductive layer is adjacent the integrated circuit substrate and the second conductive layer is remote from the integrated circuit substrate;

a third continuous conductive layer between the first and second spaced apart conductive layers and electrically connected to the first and second spaced apart conductive layers; and an array of spaced apart insulating islands in the third continuous conductive layer and extending therethrough such that sidewalls of the insulating islands are surrounded by the third continuous conductive layer.

24. An integrated circuit according to claim 23 wherein the array of spaced apart insulating islands is a first array of spaced apart insulating islands, the bonding pad further comprising:

a fourth continuous conductive layer between the third continuous conductive layer and the second conductive layer and electrically connected to the third continuous conductive layer and to the second conductive layer; and a second array of spaced apart insulating islands in the fourth continuous conductive layer and extending therethrough such that sidewalls of the second array of insulating islands are surrounded by the fourth continuous conductive layer.

25. An integrated circuit according to claim 24 further comprising:

a fifth conductive layer between the third and fourth continuous conductive layers.

26. An integrated circuit according to claim 24 further comprising:

a fifth continuous conductive layer between the third and fourth continuous conductive layers; and a third array of spaced apart insulating islands in the fifth continuous conductive layer and extending therethrough such that sidewalls of the third array of insulating islands are surrounded by the fifth continuous conductive layer.

27. An integrated circuit according to claim 24 wherein the first and second arrays of spaced apart insulating islands laterally overlap each other.

28. An integrated circuit according to claim 24 wherein the first and second arrays of spaced apart insulating islands are congruent to each other.

29. An integrated circuit according to claim 26 wherein the first, second and third arrays of spaced apart insulating islands laterally overlap each other.

30. An integrated circuit according to claim 29 wherein the first and second arrays of spaced apart insulating islands also are congruent to each other.

31. An integrated circuit according to claim 30 wherein the third array of spaced apart insulating islands are of same shape as the first array of spaced part insulating islands but of different sizes.

32. An integrated circuit according to claim 23 wherein the first and second spaced apart conductive layers are first and second solid spaced apart conductive layers.

33. An integrated circuit according to claim 23 wherein the third continuous conductive layer includes a peripheral portion and a central portion and wherein the array of spaced apart insulating islands in the third continuous conductive layer is located in the peripheral portion but not in the central portion.

34. An integrated circuit according to claim 23 wherein the sidewalls of the insulating islands are cylindrical shaped, polygonal shaped or combinations thereof.

35. An integrated circuit comprising:
    an integrated circuit substrate; and
    an array of bonding pads on the integrated circuit substrate, at least one of the bonding pads having an internal structure comprising:
        an upper pad layer that is remote from the integrated circuit substrate;
        a lower pad layer that is adjacent the integrated circuit substrate;
        an intermediate pad layer between the upper pad layer and the lower pad layer, the upper pad layer, the intermediate pad layer and the lower pad layer being spaced apart from one another;
        a first continuous conductive plug between the upper and intermediate pad layers and electrically connected to the upper and intermediate pad layers;
        a first array of spaced apart first insulating islands in the first continuous conductive plug and extending therethrough such that sidewalls of the first insulating islands are surrounded by the first continuous conductive plug;
        a second continuous conductive plug between the lower and intermediate pad layers and electrically connected to the lower and intermediate pad layers; and
        a second array of second spaced apart insulating islands in the second continuous conductive plug and extending therethrough such that sidewalls of the second insulating islands are surrounded by the second continuous conductive plug.

36. An integrated circuit according to claim 35 wherein the first and second arrays of spaced apart insulating islands laterally overlap each other.

37. An integrated circuit according to claim 36 wherein the first and second arrays of spaced apart insulating islands are congruent to each other.

38. An integrated circuit according to claim 35 further comprising:
    a third array of spaced apart third insulating islands in the intermediate pad layer and extending therethrough such that sidewalls of the third insulating islands are surrounded by the intermediate pad layer.

39. An integrated circuit according to claim 38 wherein the first, second and third arrays of spaced apart insulating islands laterally overlap each other.

40. An integrated circuit according to claim 39 wherein the first and second arrays of spaced apart insulating islands also are congruent to each other.

41. An integrated circuit according to claim 40 wherein the third array of spaced apart insulating islands is of same shape as the first array of spaced part insulating islands but of different size.

42. An integrated circuit according to claim 35 wherein the upper, lower and intermediate pad layers are solid upper, lower and intermediate pad layers.

43. An integrated circuit according to claim 35 wherein the first and second continuous conductive plugs each includes a peripheral portion and a central portion and wherein the first and second arrays of spaced apart first and second insulating islands in the respective first and second continuous conductive plugs are located in the peripheral portions but not in the central portions.

44. An integrated circuit according to claim 35 wherein the sidewalls of the first and second insulating islands are cylindrical shaped, polygonal shaped or combinations thereof.

45. An internal structure of a bonding pad for an integrated circuit having an array of bonding pads thereon, the internal structure of a bonding pad comprising:
    first and second spaced apart conductive layers;
    a third continuous conductive layer between the first and second spaced apart conductive layers and electrically connected to the first and second spaced apart conductive layers; and
    an insulating island in the third continuous conductive layer and extending therethrough such that the sidewall of the insulating island is surrounded by the third continuous conductive layer.

46. A bonding pad according to claim 45 wherein the insulating island is a first insulating island, the bonding pad further comprising:
    a fourth continuous conductive layer between the third continuous conductive layer and the second conductive layer and electrically connected to the third continuous conductive layer and to the second conductive layer; and
    at least a second insulating island in the fourth continuous conductive layer and extending therethrough such that the sidewall of the at least a second insulating island is surrounded by the fourth continuous conductive layer.

47. A bonding pad according to claim 46 further comprising:
    a fifth continuous conductive layer between the third and fourth continuous conductive layers; and
    at least a third insulating island in the fifth continuous conductive layer and extending therethrough such that the sidewall of the at least a third insulating island is surrounded by the fifth continuous conductive layer.

48. An internal structure of a bonding pad for an integrated circuit having an array of bonding pads thereon, the internal structure of a bonding pad comprising:
    an upper pad layer for attachment of a wire thereto;
    a lower pad layer for attachment to an integrated circuit;
    an intermediate pad layer between the upper pad layer and the lower pad layer, the upper pad layer, the intermediate pad layer and the lower pad layer being spaced apart from one another;
    a first continuous conductive plug between the upper and intermediate pad layers and electrically connected to the upper and intermediate pad layers;
    at least a first insulating island in the first continuous conductive plug and extending therethrough such that the sidewall of the at least a first insulating island is surrounded by the first continuous conductive plug;
    a second continuous conductive plug between the lower and intermediate pad layers and electrically connected to the lower and intermediate pad layers; and
    at least a second insulating island in the second continuous conductive plug and extending therethrough such that the sidewall of the at least a second insulating island is surrounded by the second continuous conductive plug.

49. A bonding pad according to claim 48 further comprising:

at least a third insulating island in the intermediate pad layer and extending therethrough such that the sidewall of the at least a third insulating island is surrounded by the intermediate pad layer.

\* \* \* \* \*